United States Patent
Lim et al.

(10) Patent No.: US 9,627,071 B2
(45) Date of Patent: Apr. 18, 2017

(54) SEMICONDUCTOR MEMORY DEVICE AND OPERATING METHOD THEREOF

(71) Applicant: SK hynix Inc., Icheon-si Gyeonggi-do (KR)

(72) Inventors: Kyoung Hoon Lim, Seoul (KR); Min Kyu Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/812,518

(22) Filed: Jul. 29, 2015

(65) Prior Publication Data
US 2016/0260484 A1    Sep. 8, 2016

(30) Foreign Application Priority Data
Mar. 6, 2015   (KR) .................. 10-2015-0031726

(51) Int. Cl.
*G11C 11/34*     (2006.01)
*G11C 16/10*     (2006.01)
*G11C 16/34*     (2006.01)

(52) U.S. Cl.
CPC .......... *G11C 16/10* (2013.01); *G11C 16/3459* (2013.01)

(58) Field of Classification Search
CPC .............................. G11C 16/10; G11C 16/3459
USPC .......................... 365/185.19, 185.18, 185.22
See application file for complete search history.

(56) References Cited

U.S. PATENT DOCUMENTS

| | | | |
|---|---|---|---|
| 6,671,207 B1 * | 12/2003 | Parker ................. | G11C 11/5628 365/185.03 |
| 7,035,146 B2 * | 4/2006 | Hemink ............... | G11C 11/5628 365/185.03 |
| 7,796,430 B2 * | 9/2010 | Lutze ................. | G11C 16/3418 365/185.03 |
| 7,859,922 B2 | 12/2010 | Aritome | |
| 8,018,769 B2 | 9/2011 | Tu et al. | |
| 8,284,611 B2 * | 10/2012 | Lee ..................... | G11C 11/5628 365/185.03 |
| 8,885,418 B1 * | 11/2014 | Chung ............... | G11C 16/0483 365/185.03 |
| RE45,813 E * | 11/2015 | Lee | |
| 9,326,139 B2 * | 4/2016 | Johan ............... | H04N 21/25816 |
| 9,343,160 B1 * | 5/2016 | Dutta ................. | G11C 11/5635 |

(Continued)

FOREIGN PATENT DOCUMENTS

| KR | 1020090055806 A | 6/2009 |
|---|---|---|
| KR | 1020120004707 A | 1/2012 |

*Primary Examiner* — Viet Q Nguyen
(74) *Attorney, Agent, or Firm* — William Park & Associates Ltd.

(57) ABSTRACT

Disclosed are a semiconductor memory device, and an operating method thereof. The semiconductor memory device includes: a memory cell array including a plurality of memory cells; a peripheral circuit configured to perform a program pulse application operation and a verification operation on the memory cell array; a pass/fail check circuit configured to output a pass/fail signal according to a result of the verification operation; and a control logic configured to control the peripheral circuit to perform the program pulse application operation and the verification operation such that two or more program pulses are continuously applied during the program pulse application operation, and first and second verification operations are continuously performed during the verification operation.

12 Claims, 6 Drawing Sheets

(56) References Cited

U.S. PATENT DOCUMENTS

| | | | |
|---|---|---|---|
| 2004/0109362 A1* | 6/2004 | Gongwer | G11C 11/5628 365/200 |
| 2005/0185470 A1 | 8/2005 | Suzuki et al. | |
| 2006/0120165 A1* | 6/2006 | Hemink | G11C 11/5628 365/185.28 |
| 2007/0030732 A1* | 2/2007 | Micheloni | G11C 11/5628 365/185.03 |
| 2008/0055998 A1* | 3/2008 | Jung | G11C 8/10 365/185.18 |
| 2008/0117684 A1* | 5/2008 | Hemink | G11C 11/5628 365/185.19 |
| 2008/0117688 A1 | 5/2008 | Park et al. | |
| 2008/0316820 A1* | 12/2008 | Seol | G11C 11/5628 365/185.03 |
| 2009/0010067 A1* | 1/2009 | Lee | G11C 11/5628 365/185.19 |
| 2009/0213652 A1* | 8/2009 | Park | G11C 16/3418 365/185.03 |
| 2009/0232017 A1 | 9/2009 | Carlisle | |
| 2010/0034019 A1 | 2/2010 | Kang et al. | |
| 2010/0091568 A1* | 4/2010 | Li | G11C 11/5628 365/185.09 |
| 2010/0110792 A1* | 5/2010 | Lutze | G11C 16/0483 365/185.17 |
| 2010/0149881 A1* | 6/2010 | Lee | G11C 11/5635 365/185.33 |
| 2010/0284219 A1* | 11/2010 | Kim | G11C 11/5628 365/185.03 |
| 2011/0292724 A1 | 12/2011 | Kim | |
| 2012/0127791 A1 | 5/2012 | Lee | |
| 2012/0155183 A1* | 6/2012 | Aritome | G11C 16/0483 365/185.19 |
| 2012/0159277 A1 | 6/2012 | Hoei | |
| 2012/0218818 A1* | 8/2012 | Han | G11C 11/5628 365/185.03 |
| 2013/0033936 A1* | 2/2013 | Aritome | G11C 11/5628 365/185.19 |
| 2013/0039130 A1 | 2/2013 | Lee | |
| 2013/0163331 A1* | 6/2013 | Yoo | G11C 16/3459 365/185.11 |
| 2013/0301351 A1* | 11/2013 | Dutta | G11C 16/3418 365/185.02 |
| 2015/0078093 A1 | 3/2015 | Hahn et al. | |

* cited by examiner

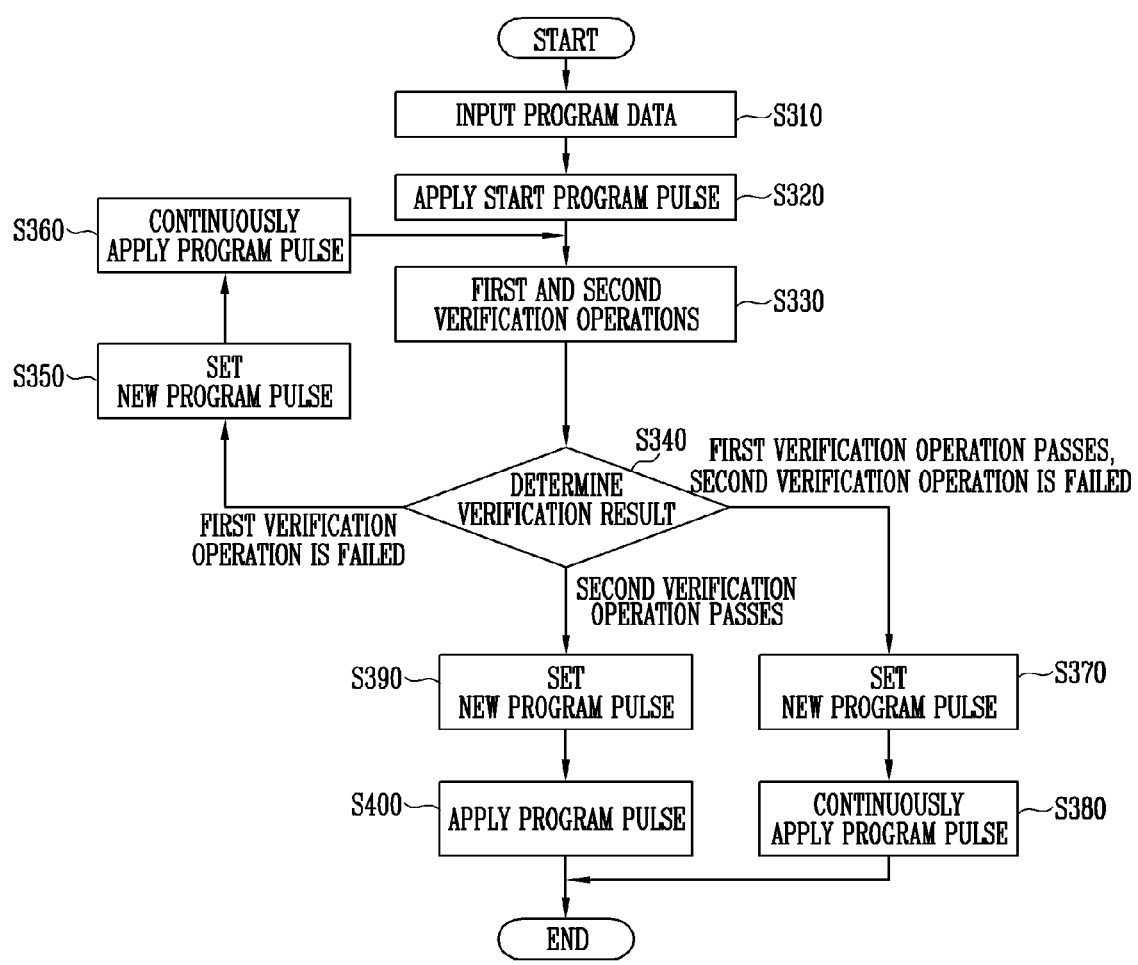

SEMICONDUCTOR MEMORY DEVICE AND OPERATING METHOD THEREOF

CROSS-REFERENCE TO RELATED APPLICATION

The present application claims priority to Korean patent application number 10-2015-0031726, filed on Mar. 6, 2015, in the Korean Intellectual Property Office, the entire disclosure of which is incorporated by reference herein.

BACKGROUND

1. Field

The invention relates to an electronic device, and more particularly, to a semiconductor memory device and an operating method thereof.

2. Discussion of Related Art

A semiconductor memory device among semiconductor devices is generally classified into a volatile memory device and a nonvolatile memory device.

The nonvolatile memory device has a relatively low write and read rate, but stored data is maintained even though a power supply is blocked. Accordingly, the nonvolatile memory device is used in order to store data which needs to be maintained regardless of the power supply. The nonvolatile memory device includes a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally divided into a NOR type and a NAND type.

The flash memory has an advantage of the RAM that data is freely programmed and erased, and an advantage of the ROM that stored data can be maintained even though a power supply is blocked. The flash memory is widely used as a storage medium of a portable electronic device, such as a digital camera, a Personal Digital Assistant (PDA), and an MP3 player.

SUMMARY

An embodiment of the invention provides a semiconductor memory device, including a memory cell array including a plurality of memory cells. The semiconductor memory device may also include a peripheral circuit configured to perform a program pulse application operation and a verification operation on the memory cell array. The semiconductor memory device may also include a pass/fail check circuit configured to output a pass/fail signal according to a result of the verification operation. The semiconductor memory device may also include a control logic configured to control the peripheral circuit to perform the program pulse application operation and the verification operation such that two or more program pulses are continuously applied during the program pulse application operation, and first and second verification operations are continuously performed during the verification operation.

In an embodiment of the invention provides a method of operating a semiconductor memory device, including applying a program pulse to selected memory cells among a plurality of memory cells. The method also includes continuously performing first and second verification operations using different first and second verification voltages. Further, when it is determined that the first verification operation has failed, continuously applying new program pulses obtained by increasing a previously applied program pulse by a step voltage and two times of the step voltage to the selected memory cells, and then re-performing from the first and second verification operations.

In an embodiment of the invention provides a method of operating a semiconductor memory device, including applying a program pulse to selected memory cells among a plurality of memory cells. The method also includes continuously performing first and second verification operations using different first and second verification voltages. Further, when it is determined that the first verification operation has failed, continuously applying new program pulses obtained by increasing a previously applied program pulse by a step voltage and two times of the step voltage to the selected memory cells; and then re-performing from the first and second verification operations, in which after the applying of the program pulse, a discharge operation and a precharge operation of a bit line electrically coupled to the selected memory cells are performed before performing the first verification operation. Further, the discharge operation and the precharge operation of the bit line are skipped when the first verification operation is completed and then the second verification operation is performed.

BRIEF DESCRIPTION OF THE DRAWINGS

FIG. 3 is a flowchart for describing an operating method of the semiconductor memory device according to the invention;

DETAILED DESCRIPTION

Advantages and features of the invention and methods of achieving the advantages and features will be clear with reference to embodiments described in detail below together with the accompanying figures. However, the invention is not limited to the embodiments described herein, and may be implemented in various different forms. Moreover, the embodiments described herein are provided so as to describe the invention in detail so that those skilled in the art may easily carry out the technical spirit of the invention. The invention has been made in an effort to provide a semiconductor memory device, which is capable of improving a speed of a program operation, and an operating method thereof. According to an embodiment of the invention, it is possible to skip a precharge operation and a discharge operation of a bit line of a memory cell array by continuously performing two verification operations during a verification operation in a program operation, thereby increasing a program operation speed.

Throughout this specification and the claims that follow, when it is described that an element is "electrically coupled" to another element, the element may be "directly electrically coupled" to the other element or "indirectly electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
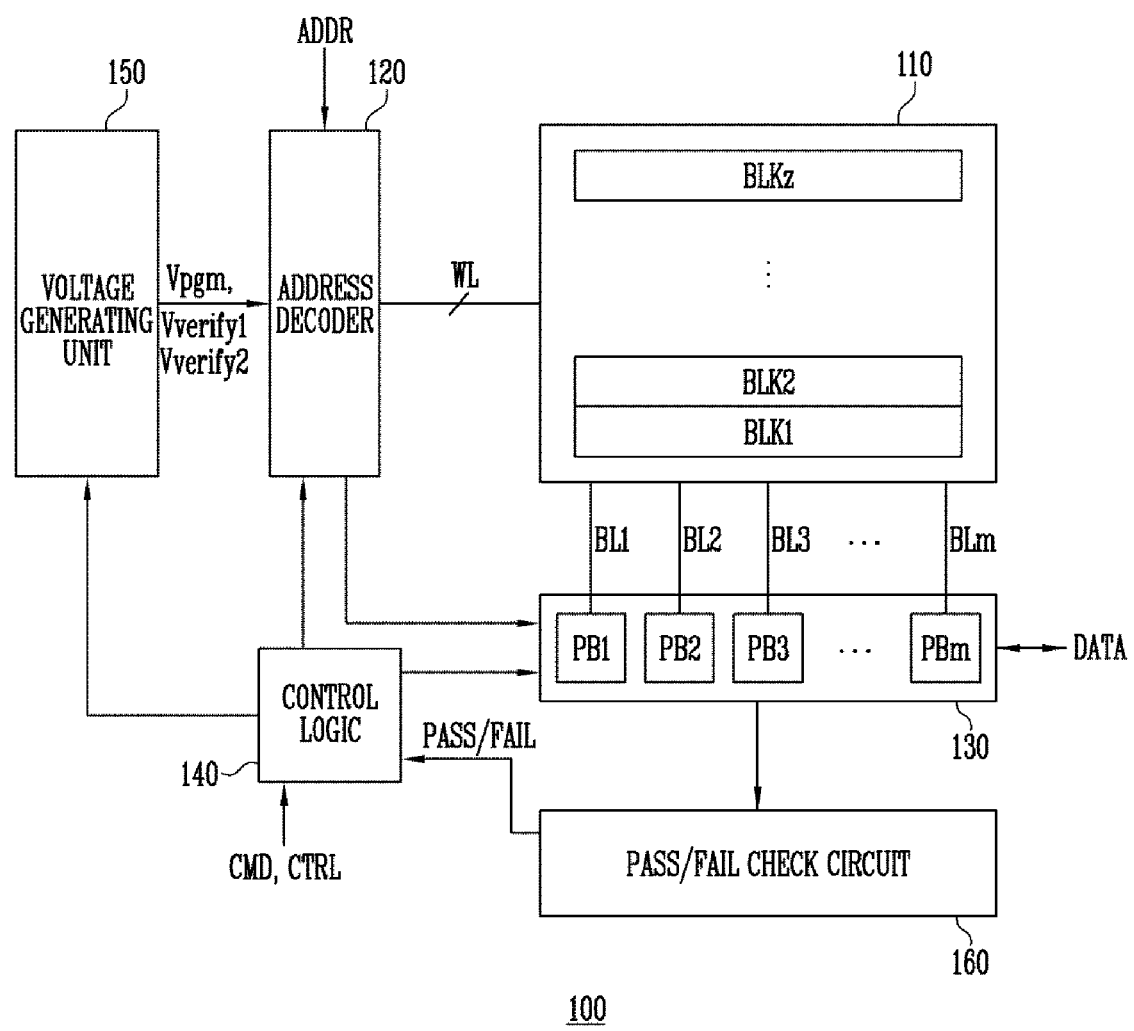
FIG. 1 is a block diagram illustrating a semiconductor memory device according to the invention.

Referring to FIG. 1, a block diagram illustrating a semiconductor memory device according to the invention is described.

In FIG. 1, a semiconductor 100 includes a memory cell array 110, an address decoder 120, a read and write circuit 130, a control logic 140, a voltage generating unit 150, and a pass/fail check circuit 160.

The memory cell array 110 includes a plurality of memory blocks BLK1 to BLKz. The plurality of memory blocks BLK1 to BLKz is electrically coupled to the address decoder 120 through word lines WL. The plurality of memory blocks BLK1 to BLKz are electrically coupled to the read and write circuit 130 through bit lines BL1 to BLm. Each of the memory blocks BLK1 to BLKz includes the plurality of memory cells. In an embodiment, the plurality of memory cells is a nonvolatile memory cell. Memory cells electrically coupled to the same word line among the plurality of memory cells are defined as one page. That is, the memory cell array 110 is formed of a plurality of pages.

The address decoder 120, the read and write circuit 130, and the voltage generating unit 150 are operated as peripheral circuits for driving the memory cell array 110.

The address decoder 120 is electrically coupled to the memory cell array 110 through the word lines WL. The address decoder 120 is configured to be operated in response to a control by the control logic 140.

The address decoder 120 receives an address ADDR through an input/output buffer inside the semiconductor memory device 100.

The address decoder 120 applies a program pulse Vpgm generated in the voltage generating unit 150 to a selected word line among the word lines of the selected memory block during a program pulse application operation in the program operation. The address decoder 120 also applies a first and second verification voltage Vverify1 and Vverify2 generated by the voltage generating unit 150 to a selected word line among the word lines of the selected memory block during a program verification operation. In this case, the address decoder 120 may continuously apply different program pulses Vpgm during the program pulse application operation, or continuously apply different first and second verification voltages Vverify1 and Vverify2 during the program verification operation.

The program operation of the semiconductor memory device 100 is performed in the unit of a page. An address ADDR received when a program operation is requested includes a block address, a row address, and a column address. The address decoder 120 selects one memory block and one word line according to the block address and the row address. The column address is decoded by the address decoder 120 to be provided to the read and write circuit 130.

The read and write circuit 130 includes a plurality of page buffers PB1 to PBm. The plurality of page buffers PB1 to PBn are electrically coupled to the memory cell array 110 through the bit lines BL1 to BLm. Each of the plurality of page buffers PB1 to PBm temporally stores data DATA input from the outside during the program operation, and controls a potential level of a corresponding bit line with a program permission voltage or a program inhibition voltage according to the stored data. Further, each of the plurality of page buffers PB1 to PBm senses a program state of a corresponding memory cell and verifies the program operation by using the sensed program state during a program verification operation. Further, the plurality of page buffers PB1 to PBm may newly precharge or discharge the bit line for a next operation after once program verification operation is completed. However, when the plurality of page buffers PB1 to PBm performs the continuous verification operation by using the different first and second verification voltages Vverify1 and Vverify2, the plurality of page buffers PB1 to PBm may perform the program verification operation by using the first verification voltage Vverify1; and then perform the program verification operation by using the second verification voltage Vverify2 without the precharge and discharge operation for the bit line, thereby decreasing the entire program operation time.

The read and write circuit 130 is operated in response to a control by the control logic 140.

In an embodiment, the read and write circuit 130 may include the page buffers (or page registers), a column selection circuit, and the like.

The control logic 140 is electrically coupled to the address decoder 120, the read and write circuit 130, and the voltage generating unit 150. The control logic 140 receives a command CMD and a control signal CTRL through an input/output buffer of the semiconductor memory device 100. The control logic 140 is configured to control a general operation of the semiconductor memory device 100 in response to the command CMD and the control signal CTRL. Further, the control logic 140 controls the voltage generating unit 150 and the address decoder 120 so that the program pulse Vpgm or the first and second verification voltage Vverify1 and Vverify2 are applied to the selected memory block during the performance of the program operation on the memory cell array 110; controls a potential of the bit line of the memory cell array 110; or controls the read and write circuit 130 so as to perform the program and the program verification operation are performed by sensing a potential of the bit line. Further, the control logic 140 may control peripheral circuits to determine first and second program verification operation results according to a pass or fail signal output by the pass/fail check circuit 160, and selectively perform a next operation.

The voltage generating unit 150 generates the program pulse Vpgm to be applied to a selected memory block during the program pulse application operation. The voltage generating unit 150 also generates the first and second verification voltages Vverify1 and Vverify2 to be applied to a selected memory block during the program verification operation. The voltage generating unit 150 generates a new program pulse by increasing the program pulse Vpgm by a step voltage during an Incremental Step Pulse Program (ISPP) operation. The second verification voltage Vverify2 is a target threshold voltage, for programming the memory cells. The first verification voltage Vverify1 is a voltage lower than the second verification voltage Vverify2 by the step voltage.

The pass/fail check circuit 160 receives a verification signal from the plurality of page buffers PB1 to PBm of the read and write circuit 130 during the program verification operation. The pass/fail check circuit 160 also counts the number of memory cells, which are not completely programmed according to the received verification signal, and outputs the pass or fail signal. In this case, when the number of counted memory cells is larger than a permitted number, the pass/fail check circuit 160 outputs the fail signal FAIL. Further, when the number of counted memory cells is smaller than the permitted number, the pass/fail check circuit 160 outputs the pass signal PASS.

Figure 2:
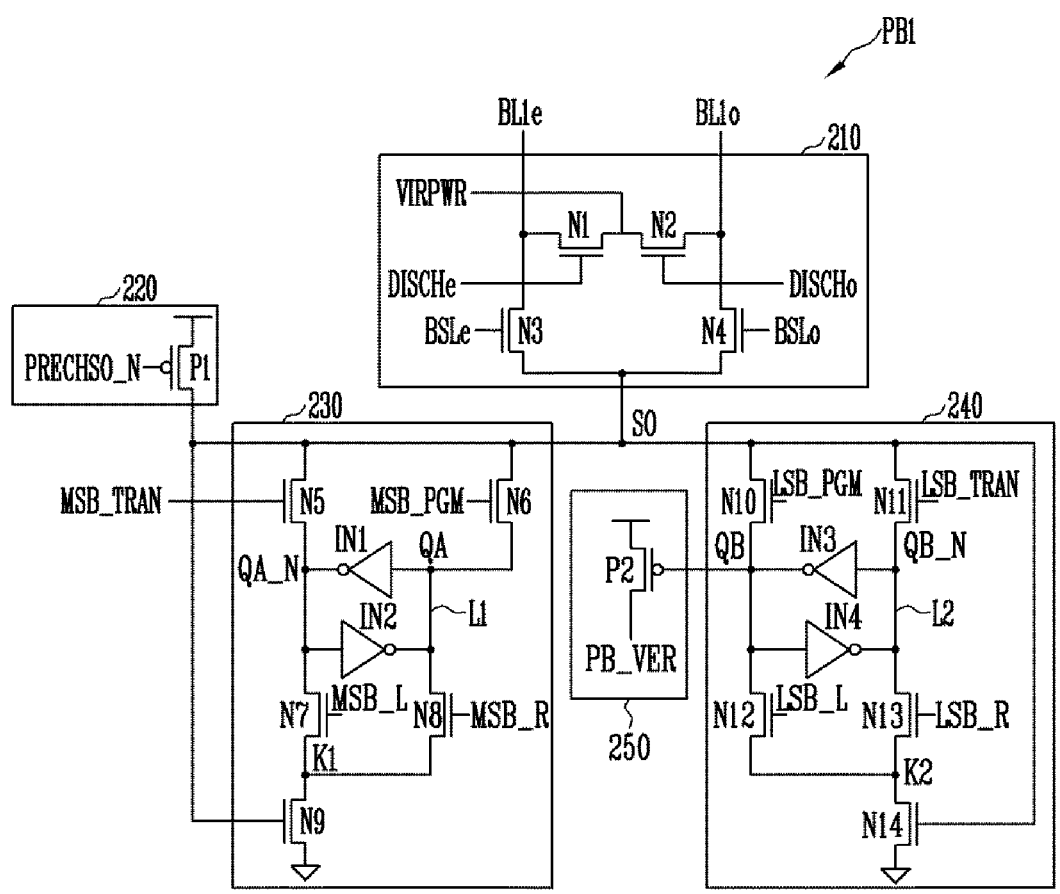
FIG. 2 is a circuit diagram for describing a page buffer of FIG. 1.

Referring to FIG. 2, a circuit diagram for describing the page buffer of FIG. 1 is described.

In FIG. 2, the page buffer PB1 includes a bit line selection unit 210, a precharge unit 220, first and second latch units 230 and 240, and a verification unit 250.

The bit line selection unit 210 selects an even bit line BL1e and an odd bit line BL1o. The bit line selection unit 210 also electrically couples the selected even bit line BL1e and odd bit line BL1o to a sensing node SO. The precharge unit 220 precharges the sensing node.

Each of the first and second latch units 230 and 240 includes a latch circuit for storing data, and store data for programming or stores read data.

The verification unit 250 is electrically coupled to a latch node of the second latch unit 240, and outputs a verification signal PB_VER according to a data state of the latch node.

In an embodiment of the invention, it is illustrated an embodiment in which one page buffer PB1 is electrically coupled to one pair of bit lines BL1e and BL1o, but one page buffer may be electrically coupled with one bit line.

A circuit of the page buffer PB includes first to fourteenth NMOS transistors N1 to N14, first to fourth inverters IN1 to IN4, and first and second PMOS transistors P1 and P2.

The first and second NMOS transistors N1 and N2 are serially electrically coupled between the even bit line BL1e and the odd bit line BL1o. Further, a virtual voltage VIRPWR is input into a contact point of the first and second NMOS transistors N1 and N2.

Further, an even discharge control signal DISCHe is input into a gate of the first NMOS transistor N1, and an odd discharge control signal DISCHo is input into a gate of the second NMOS transistor N2.

The third NMOS transistor N3 is electrically coupled between the even bit line BL1e and the sensing node SO. In addition, the fourth NMOS transistor N4 is electrically coupled between the odd bit line BL1o and the sensing node SO.

An even bit line selection signal BSLe is input to a gate of the third NMOS transistor N3. Further, an odd bit line selection signal BSLo is input to a gate of the fourth NMOS transistor BSLo N4.

The first PMOS transistor P1 is electrically coupled between a power voltage and the sensing node SO. In addition, a precharge control signal PRECHSO_N is input into a gate of the first PMOS transistor P1.

The fifth NMOS transistor N5 is electrically coupled between the sensing node SO and a node QA_N, and the sixth NMOS transistor N6 is electrically coupled between the sensing node SO and a node QA. A Most Significant Bit (MSB) transmission signal MSB_TRAN is input into a gate of the fifth NMOS transistor N5. In addition, an MSB program signal MSB_PGM is input into a gate of the sixth NMOS transistor N6.

The first and second inverters IN1 and IN2 are electrically coupled between the node QA_N and the node QA.

The seventh NMOS transistor N7 is electrically coupled between the node QA_N and a node K1, and the eighth NMOS transistor N8 is electrically coupled between the node QA and the node K1. A first MSB latch signal MSB_L is input into a gate of the seventh NMOS transistor N7, and a second MSB latch signal MSB_R is input into a gate of the eighth NMOS transistor N8.

The ninth NMOS transistor N9 is electrically coupled between the node K1 and a ground node, and a gate of the ninth NMOS transistor N9 is electrically coupled to the sensing node SO. The ninth NMOS transistor N9 performs a data sensing function of sensing a voltage level of the sensing node SO and electrically coupling the node K1 to the ground node.

The tenth NMOS transistor N10 is electrically coupled between the sensing node SO and a node QB, and the eleventh NMOS transistor N11 is electrically coupled between the sensing node SO and a node QB_N. A least Significant Bit (LSB) program signal LSB_PGM is input into a gate of the tenth NMOS transistor N10, and an LSB transmission signal LSB_TRAN is input into a gate of the eleventh NMOS transistor N11.

The third and fourth inverters IN3 and IN4 are electrically coupled to the second latch L2 between the node QB and the node QB_N. A first latch L1 is also illustrated.

The twelfth NMOS transistor N12 is electrically coupled between the node QB and a node K2, and the thirteenth NMOS transistor N13 is electrically coupled between the node QB_N and the node K2. A first LSB latch signal LSB_L is input into a gate of the twelfth NMOS transistor N12, and a second LSB latch signal LSB_R is input into a gate of the thirteenth NMOS transistor N13.

The fourteenth NMOS transistor N14 is electrically coupled between the node K2 and the ground node, and a gate of the fourteenth NMOS transistor N14 is electrically coupled to the sensing node. The fourteenth NMOS transistor N14 performs a data sensing function for electrically coupling the node K2 to the ground node according to a voltage level of the sensing node SO, similar to the ninth NMOS transistor N9.

The second PMOS transistor P2 is electrically coupled between the power voltage and an output terminal of the verification signal PB_VER, and a gate of the second PMOS transistor P2 is electrically coupled to the node QB.

The first latch unit 230 of the page buffer PB1 according to an embodiment of the invention receives data to be programmed from the outside and stores the received data. Further, the second latch unit 240 stores verification data after the first latch unit 230 receives the data to be programmed and perform the programming.

An operation of the page buffer PB1 will be described in detail.

First, in an embodiment of the invention, it is assumed that a memory cell electrically coupled to the even bit line BL13 is programmed. Further, when "0" data is input, the programming is performed, and when "1" data is input, the programming is inhibited.

When data to be programmed is "0", "0" data is input into the node QA.

"0" input into the node QA is transmitted to the node QB of the second latch unit 240. To this end, the precharge control signal PRECHSO_N is applied with a low level to precharge the sensing node SO with a high level.

Further, the MSB transmission signal MSB_TRAN is input with a high level, so that the fifth NMOS transistor N5 is turned on. When the fifth NMOS transistor N5 is turned on, the sensing node SO is maintained at a high level by "1" data latched in the node QA_N.

When the sensing node SO is a high level, the fourteenth NMOS transistor N14 is turned on. Accordingly, the node K2 is electrically coupled to the ground node. Further, when the first LSB latch signal LSB_L is applied with a high level, "0" data is input into the node QB.

"0" data input into the node QB is programmed in a selected memory cell electrically coupled to the even bit line BL1e. The program operation is performed by applying a program pulse to the word line electrically coupled to the selected memory cell. Further, a verification for verifying a program result is performed.

The program verification operation first precharges the sensing node SO with a high level, and then the even bit line selection signal BSLe is applied with a first voltage V1 level to precharge the even bit line BL1e. Further, the even bit line selection signal BSLe is changed to have a low level to turn off the third NMOS transistor N3.

Further, a read voltage Vread is applied to the word line of the selected memory cell, and a pass voltage Vpass is applied to the remaining word lines to have an evaluation time.

When the selected memory cell is completely programmed to have a threshold voltage equal to or larger than the read voltage Vread for the evaluation time, a precharged voltage of an even bit line voltage is maintained as it is. However, when the selected memory cell is not completely programmed to a state of having the threshold voltage equal to or larger than the read voltage Vread, the even bit line is discharged.

After the evaluation time, the even bit line selection signal BSLe is applied with a second voltage V2 level. In this case, the sensing node SO is in a state of being precharged with a high level.

When the even bit line BL1e maintains the precharge state to maintain a higher voltage than the second voltage V2, the third NMOS transistor N3 is not turned on. Further, when the even bit line BL1e is discharged to be a voltage state lower than the second voltage V2, the third NMOS transistor N3 is turned on. When the third NMOS transistor N3 is turned on, a voltage of the sensing node SO is discharged.

When the selected memory cell is completely programmed, the sensing node SO is maintained with the high level. Further, when the selected memory cell is not programmed, the sensing node SO becomes a low level.

When the selected memory cell is completely programmed, the fourteenth NMOS transistor N14 is turned on by the high-level sensing node SO, and the node K2 is electrically coupled to the ground node. Further, when the second LSB latch signal LSB_R is applied with a high level, the node QB_N becomes to have a low level, and the node QB is changed to have a high level.

When the selected memory cell is not programmed, the sensing node SO has the low level, thereby not influencing the change of the data of the second latch L2 as a matter of course.

As a result, when the node QB becomes a "1" state, the bit line is program-inhibited for a next program pulse so that the programming is not performed any more.

The page buffer PB1 is electrically coupled to each of all of the pairs of bit lines as described above.

Accordingly, when the programming of one page is performed, in order to check when all of the memory cells are completely programmed, the verification signal PB_VER output by the verification unit 250 of each page buffer PB is used.

The node QB is in a "0" state in the state where the programming is not completed. Accordingly, the second PMOS transistor P2 is maintained in the turned on state, the verification signal PB_VER of a high level is input.

However, when the programming is completed, the node QB becomes the "1" state, and the second PMOS transistor P2 is turned off, so that the verification signal PB_VER is not output with the high level any longer. In addition, a verification signal output terminal becomes a floating state.

The aforementioned page buffer PB1 performs a discharge operation and a precharge operation to initialize a potential level of the bit line after the program pulse application operation and before the verification operation. Further, when the page buffer PB1 performs the continuous pulse application operation and the continuous verification operation, the page buffer PB1 skips the bit line discharge and the precharge operation to decrease the program operation time.

Referring to FIG. 3, a flowchart for describing an operating method of the semiconductor memory device according to the invention is described.

Figure 4A:
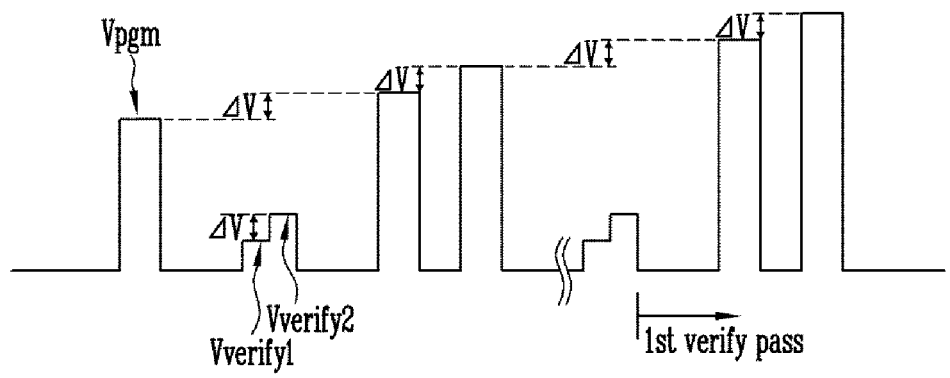
FIGS. 4A and 4B are waveform diagrams of a program pulse and a verification voltage for describing the operating method of the semiconductor memory device according to the invention.
Figure 4B:
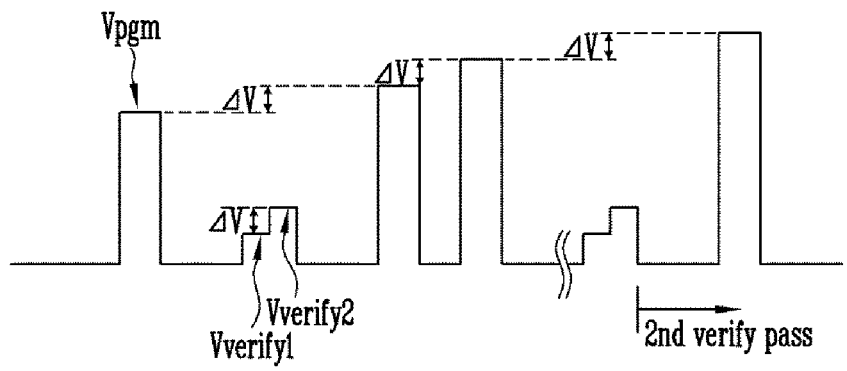

Referring to FIGS. 4A and 4B, waveform diagrams of a program pulse and a verification voltage for describing the operating method of the semiconductor memory device according to the invention are described.

An operating method of the semiconductor memory device according to the invention will be described below with reference to FIGS. 1 to 4B.

1) Input Program Data (S310)

When a command CMD and a control signal CTRL for a program operation are input from the outside, the control logic 140 temporally stores program data DAT input from the outside in the plurality of page buffers PB1 to PBm by controlling the read and write circuit 130.

The plurality of page buffers PB1 to PBm stores the program data DATA in the second latch 240. The plurality of page buffers PB1 to PBM also control a potential level of a selected bit line according to the program data stored in the second latch 240.

2) Apply a Start Program Pulse (S320)

The control logic 140 controls the voltage generating unit 150 to generate a start program pulse Vpgm initially applied to memory cells. The start program pulse Vpgm generated in the voltage generating unit 150 is applied to a selected word line among the plurality of word lines WL by the address decoder 120.

3) First and Second Verification Operations (S330)

When one program pulse application operation is completed, the control logic 140 controls the voltage generating unit 150 to verify first and second verification voltages Vverify1 and Vverify2. The first and second verification voltages Vverify1 and Vverify2 generated by the voltage generating unit 150 are applied to the selected word line among the plurality of word lines WL by the address decoder 120. In this case, the first and second verification voltages Vverify1 and Vverify2 are continuously applied. Further, the second verification voltage Vverify2 is a voltage higher than the first verification voltage Vverify1 by a step voltage ΔV, and a target threshold voltage value for programming the memory cells.

The plurality of page buffers PB1 to PBm performs the verification operation by sensing the potential levels of the corresponding bit lines during the first verification operation, for which the first verification voltage Vverify1 is applied, and outputs the sensed potential level to the pass/fail check circuit 160 as a verification signal PB_VER. The pass/fail check circuit 160 outputs the pass/fail signal PASS/FAIL for the first verification operation by using the verification signal PB_VER received from the plurality of page buffers PB1 to PBm. For example, the pass/fail check circuit 160 counts the number of memory cells, which are not completely programmed, according to the received verification signals PB_VER. The pass/fail check circuit 160 also outputs the pass or fail signal PASS or FAIL. In this case, when the number of counted memory cells is larger than a permitted number, the pass/fail check circuit 16 outputs the fail signal FAIL. Further, when the number of counted memory cells is smaller than the permitted number, the pass/fail check circuit 16 outputs the pass signal PASS.

After the first verification operation is completed, a second verification operation, in which the second verification voltage Vverify2 is applied, is performed. In this case, the plurality of page buffers PB1 to PBm may skip the discharge operation and the precharge operation for initializing the potential level of the corresponding bit line by continuously performing the first verification operation and the second verification operation.

The plurality of page buffers PB1 to PBm performs the verification operation by sensing the potential levels of the corresponding bit lines during the second verification operation. The plurality of page buffers PB1 to PBM also output the sensed potential level to the pass/fail check circuit 160 as the verification signal PB_VER. The pass/fail check circuit 160 outputs the pass/fail signal PASS/FAIL for the second verification operation by using the verification signal PB_VER received from the plurality of page buffers PB1 to PBm.

4) Determine a Verification Result (S340)

The control logic 140 receives the pass or fail signal PASS or FAIL received from the pass/fail check circuit 160, and determines the results of the first and second verification operations.

5) Set New Program Pulse (S350)

When it is determined that the first verification operation is failed in the determination of the result of the verification in S340, the control logic 140 controls the voltage generating unit 150 to set a plurality of new program pulses Vpgm, and generate the plurality of set program pulses Vpgm.

The plurality of new program pulses Vpgm may be voltages increased by the step voltage $\Delta V$ compared to the program pulse generated in a previous step, and voltages increased by two times of step voltage $2\Delta V$. In this instance, the plurality of new program pulses Vpgm are defined as an $N^{th}$ program pulse and an $N+1^{th}$ program pulse. Further, the $N+1^{th}$ program pulse is a voltage larger than the $N^{th}$ program pulse by the step voltage $\Delta V$.

6) Continuously Apply a Program Pulse (S360)

After the setting of the new program pulse (S350), the new program pulses Vpgm generated by the voltage generating unit 150 are continuously applied to the selected word line among the plurality of word lines WL by the address decoder 120. In the memory cell, for which it is determined that the second verification operation passes as the results of the first and second verification operations, the threshold voltage of the memory cell may be suppressed from being increased by applying the program inhibition voltage to the bit line during the $N^{th}$ program pulse and $N+1^{th}$ program pulse application operation. In addition, in the memory cell, for which it is determined that the first verification operation passes, the threshold voltage of the memory cell may be suppressed from being increased by applying the program inhibition voltage to the bit line during the $N+1^{th}$ program pulse application operation.

FIGS. 4A and 4B illustrate where the two program pulses are continuously applied, in such a manner that after once program pulse is applied, a next program pulse is applied after a predetermined time, but after one program pulse is applied, a next program pulse may be immediately applied.

After the continuous program pulse application operations, from the first and second verification operations S330 are performed again.

7) Set New Program Pulse (S370)

When it is determined that the first verification operation passes and the second verification operation is failed in the determination of the result of the verification in S340, the control logic 140 controls the voltage generating unit 150 to set a plurality of new program pulses Vpgm, and generate the plurality of set program pulses Vpgm.

The plurality of new program pulses Vpgm may be voltages increased by the step voltage $\Delta V$ compared to the program pulse generated in a previous step, and voltages increased by two times of step voltage $2\Delta V$. In this case, the plurality of new program pulses Vpgm are defined as an $N^{th}$ program pulse and an $N+1^{th}$ program pulse. Further, the $N+1^{th}$ program pulse is a voltage larger than the $N^{th}$ program pulse by the step voltage $\Delta V$.

8) Continuously Apply a Program Pulse (S380)

After the setting of the new program pulse (S370), the $N^{th}$ program pulses and the $N+1^{th}$ program pulse generated by the voltage generating unit 150 are continuously applied to the selected word line among the plurality of word lines WL by the address decoder 120.

In the memory cell, for which it is determined that the second verification operation passes as the results of the first and second verification operations, the threshold voltage of the memory cell may be suppressed from being increased by applying the program inhibition voltage to the bit line during the $N^{th}$ program pulse and $N+1^{th}$ program pulse application operation. Further, in the memory cell, for which it is determined that the first verification operation passes, the threshold voltage of the memory cell may be suppressed from being increased by applying the program inhibition voltage to the bit line during the $N+1^{th}$ program pulse application operation.

When it is determined that the first verification operation passes and the second verification operation is failed, the threshold voltages of the most memory cells exist between the first verification voltage Vverify1 and the second verification voltage Vverify2. In addition, only the threshold voltages of some memory cells exists in a state lower than the first verification voltage Vverify1. Accordingly, the memory cells having the threshold voltages existing between the first verification voltage Vverify1 and the second verification voltage Vverify2, are programmed to a higher state than the second verification voltage Vverify2 by the $N^{th}$ program pulse. Further, some memory cells having the threshold voltages lower than the first verification voltage Vverify1 are programmed to a higher state than the second verification voltage Vverify by the $N^{th}$ program pulse and the $N+1^{th}$ program pulse.

9) Set New Program Pulse (S390)

When it is determined that the second verification operation passes in the determination of the result of the verification in S340, the control logic 140 controls the voltage generating unit 150 to set a plurality of new program pulses Vpgm, and generate the plurality of set program pulses Vpgm.

The new program pulse Vpgm may be a voltage increased by the step voltage $\Delta V$ compared to the program pulse generated in a previous step.

10) Apply a Program Pulse (S400)

The new program pulse Vpgm generated in the setting of the new program pulse in operation S390 is applied to the selected word line among the plurality of word lines WL by the address decoder 120.

In this instance, in the memory cell, for which it is determined that the second verification operation passes, the threshold voltage of the memory cell may be suppressed from being increased by applying the program inhibition voltage to the bit line during the new program pulse Vpgm application operation.

As described above, according to the invention, it is possible to skip the bit line discharge operation and pre-charge operation for a next program operation after one verification operation by continuously performing the first and second verification operations during the verification operation in the program operation, thereby improving an entire program operation speed. Further, the number of verification operations is smaller than the total number of applied program pulses so that it is possible to decrease an entire program operation time.

Figure 5:
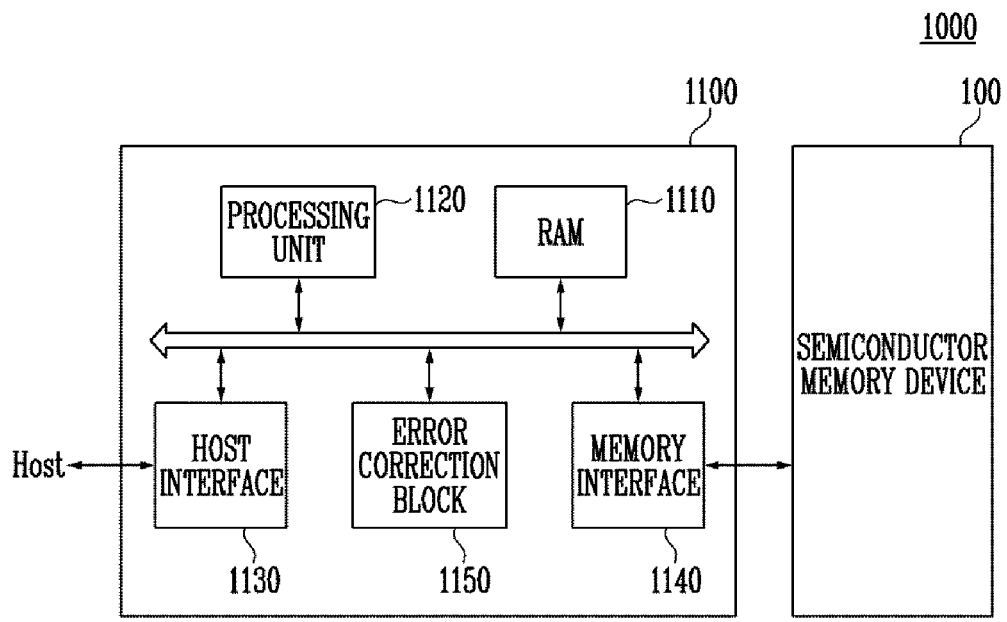
FIG. 5 is a block diagram illustrating a memory system including the semiconductor memory device of FIG. 1.

Referring to FIG. 5, a block diagram illustrating a memory system including the semiconductor memory device of FIG. 1 is described.

In FIG. 5, a memory system 1000 includes a semiconductor memory device 100 and a controller 1100.

The semiconductor memory device 100 may be configured and operated in a similar manner to that described with reference to FIG. 1. Hereinafter, overlapping descriptions will be omitted.

The controller 1100 is electrically coupled to a host Host and the semiconductor memory device 100. The controller 1100 is configured to access the semiconductor memory device 100 in response to a request from the host. For example, the controller 1100 is configured to control read, write, erase, and background operations of the semiconductor memory device 100. The controller 1100 is configured to provide an interface between the semiconductor memory device 100 and the host Host. The controller 1100 is configured to drive a firmware for controlling the semiconductor memory device 100.

The controller 1100 includes a Random Access Memory (RAM) 1110, a processing unit 1120, a host interface 1130, a memory interface 1140, and an error correction block 1150. The RAM 1110 is used as at least one among a working memory of the processing unit 1120, a cache memory between the semiconductor memory device 100 and the host Host, and a buffer memory between the semiconductor memory device 100 and the host Host. The processing unit 1120 controls a general operation of the controller 1100. Further, the controller 1100 may temporarily store program data provided from the host during the write operation.

The host interface 1130 includes a protocol for performing a data exchange between the host Host and the controller 1100. In an embodiment, the controller 1200 is configured to communicate with the host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol, and a private protocol.

The memory interface 1140 interfaces with the semiconductor memory device 100. For example, the memory interface includes a NAND interface or a NOR interface.

The error correction block 1150 is configured to detect and correct an error of the data received from the semiconductor memory device 100 by using an Error Correction Code (ECC). The processing unit 1120 may control the semiconductor memory device 100 to adjust a read voltage according to a result of the error detection of the error correction block 1150 and perform a re-read operation. In an embodiment, the error correction block may be provided as a constituent element of the controller 1100.

The controller 1100 and the semiconductor memory device 100 may be integrated into one semiconductor device. In an embodiment, the controller 1100 and the semiconductor memory device 100 may be integrated into one semiconductor device to configure a memory card. For example, the controller 1100 and the semiconductor memory device 100 may be integrated into one semiconductor device to configure a memory card, such as a PC card (Personal Computer Memory Card International Association (PCM-CIA)), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 1100 and the semiconductor memory device 100 may be integrated into one semiconductor device to configure a semiconductor drive (Solid State Drive (SSD)). The semiconductor drive (SSD) includes a storage device configured to store data in a semiconductor memory. Where the memory system 2000 is used as the SSD, a speed of the operation of the host electrically coupled to the memory system 2000 is remarkably improved.

In an example, the memory system 1000 is provided as one of various constituent elements of an electronic device, such as a computer, an ultra mobile PC (UMPC, a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, or one of various constituent elements devices configuring a computing system.

In an embodiment, the semiconductor memory device 100 or the memory system 1000 may be mounted in various types of package. For example, the semiconductor memory device 100 or the memory system 2000 may be packaged and mounted by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 6:
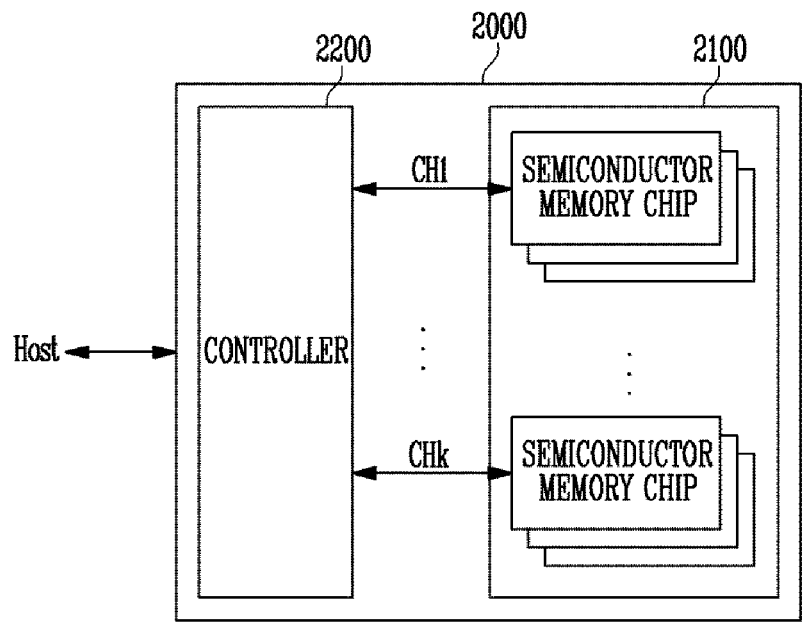
FIG. 6 is a block diagram illustrating an application example of the memory system of FIG. 5.

Referring to FIG. 6, a block diagram illustrating an application example of the memory system of FIG. 5 is described.

In FIG. 6, a memory system 2000 includes a semiconductor memory device 2100 and a controller 2200. The semiconductor memory device 2100 includes a plurality of semiconductor memory chips. The plurality of semiconductor memory chips is divided into a plurality of groups.

In FIG. 6, it is illustrated that the plurality of groups communicates with the controller 2200 through first to $k^{th}$ channels CH1 to CHk, respectively. Each semiconductor memory chip may be configured and operated in a similar manner to one in the semiconductor memory device 100 described with reference to FIG. 1.

Each group is configured to communicate with the controller 2200 through one common channel. The controller 2200 is configured in a similar manner to the controller 1100 described with reference to FIG. 5. Further, the controller 2200 is configured to control the plurality of memory chips of the semiconductor memory device 2100 through the plurality of channels CH1 to CHk.

Figure 7:
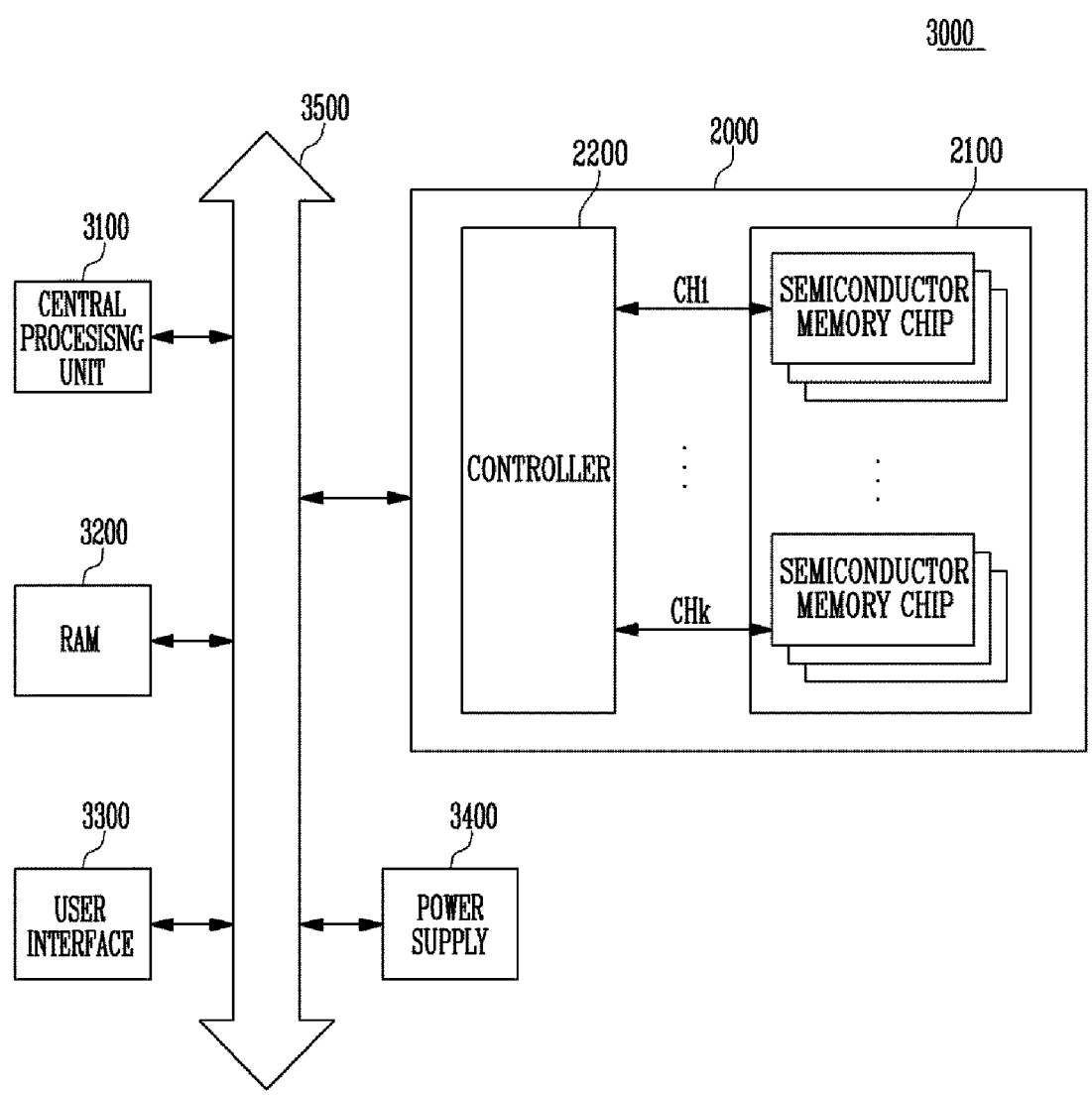
FIG. 7 is a block diagram illustrating a computing system including the memory system described with reference to FIG. 6.

Referring to FIG. 7, a block diagram illustrating a computing system including the memory system described with reference to FIG. 6 is illustrated.

In FIG. 7, a computing system 3000 includes a central processing unit 3100, a Random Access Memory (RAM) 3200, a user interface 3300, a power supply 3400, a system bus 3500, and the memory system 2000.

The memory system 2000 is electrically coupled to the central processing unit 3100, the RAM 3200, the user interface 3300, and the power supply 3400 through a system bus 3500. Data provided through the user interface 3300 or processed by the central processing unit 3100 is stored in the memory system 2000.

In FIG. 7, it is illustrated that the semiconductor memory device 2100 is electrically coupled to the system bus 3500 through the controller 2200. However, the semiconductor memory device 2100 may be configured to be directly electrically coupled to the system bus 3500. In this case, a function of the controller 2200 may be performed by the central processing unit 3100 and the RAM 3200.

In FIG. 7, it is illustrated that the memory system 2000 described with reference to FIG. 6 is provided. However, the memory system 2000 may be substituted with the memory system 1000 described with reference to FIG. 5. In an embodiment, the computing system 3000 may be configured to include all of the memory systems 2000 and 3000 described with reference to FIGS. 5 and 6.

As described above, an embodiment has been disclosed in the figures and the specification. The specific terms used herein are for purposes of illustration, and do not limit the scope of the invention defined in the claims. Accordingly, those skilled in the art will appreciate that various modifications and another equivalent example may be made without departing from the scope and spirit of the invention. Therefore, the sole technical protection scope of the invention will be defined by the technical spirit of the accompanying claims.

What is claimed is:

1. A semiconductor memory device, comprising:
a memory cell array including a plurality of memory cells;
a peripheral circuit configured to perform a program pulse application operation and a verification operation on the memory cell array;
a pass/fail check circuit configured to output a pass/fail signal according to a result of the verification operation; and
a control logic configured to control the peripheral circuit to perform the program pulse application operation and the verification operation such that two or more program pulses are sequentially applied during the program pulse application operation, and first and second verification operations are sequentially performed during the verification operation,
wherein the peripheral circuit performs the second verification operation without performing a discharge operation and a precharge operation on bit lines of the memory cell array after completing the first verification operation.

2. The semiconductor memory device of claim 1, wherein the peripheral circuit includes a voltage generating unit, which generates program pulses gradually increasing by a step voltage during the program pulse application operation, generates a first verification voltage during the first verification operation, and generates a second verification voltage larger than the first verification voltage by the step voltage during the second verification operation.

3. The semiconductor memory device of claim 1, wherein the peripheral circuit includes a read and write circuit, which is electrically coupled with the bit lines, controls potential levels of the bit lines according to program data during the program pulse application operation, and senses potentials of the bit lines and outputs a verification signal during the first and second verification operations.

4. The semiconductor memory device of claim 3, wherein the read and write circuit includes a plurality of page buffers electrically coupled with the bit lines, respectively.

5. The semiconductor memory device of claim 3, wherein the pass/fail check circuit outputs the pass/fail signal according to a number of failed memory cells during the first verification operation, and the pass/fail signal according to the number of failed memory cells during the second verification operation according to the verification signal.

6. The semiconductor memory device of claim 1, wherein when it is determined that the first verification operation is failed as results of the first and second verification operations, the control logic controls the peripheral circuit to perform the program pulse application operation by sequentially applying a first program pulse obtained by increasing the previous program pulse by a step voltage and a second program pulse obtained by increasing the first program pulse by the step voltage.

7. The semiconductor memory device of claim 1, wherein when it is determined that the first verification operation passes and the second verification operation is failed as results of the first and second verification operations, the control logic controls the peripheral circuit to sequentially apply a first program pulse obtained by increasing the previous program pulse by a step voltage and a second program pulse obtained by increasing the first program pulse by the step voltage.

8. The semiconductor memory device of claim 7, wherein when it is determined that the second verification operation passes as results of the first and second verification operations, the control logic controls the peripheral circuit to perform the program pulse application operation of applying a third program pulse obtained by increasing a previous program pulse by the step voltage and then terminating a program operation.

9. The semiconductor memory device of claim 1, wherein when a number of counted memory cells is greater than a permitted number, the pass/fail check circuit outputs a fail signal.

10. The semiconductor memory device of claim 1, wherein when a number of counted memory cells is less than a permitted number, the pass/fail check circuit outputs a pass signal.

11. The semiconductor memory device of claim 1, wherein the control logic controls a voltage generating unit to verify a first verification voltage and a second verification voltage.

12. The semiconductor memory device of claim 11, wherein the second verification voltage is a target threshold voltage for programming the plurality of memory cells.

* * * * *